United States Patent
Seki

(10) Patent No.: US 7,617,056 B2
(45) Date of Patent: Nov. 10, 2009

(54) PARAMETER EXTRACTION METHOD, METHOD FOR INSPECTING CIRCUIT OPERATION, AND STORAGE MEDIUM HAVING PROGRAM TO PERFORM THE PARAMETER EXTRACTION METHOD

(75) Inventor: Mitsuro Seki, Shizuoka (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 11/644,595

(22) Filed: Dec. 21, 2006

(65) Prior Publication Data

US 2007/0150251 A1    Jun. 28, 2007

(30) Foreign Application Priority Data

Dec. 27, 2005  (JP) ............................. 2005-376630

(51) Int. Cl.
*G06F 3/00* (2006.01)
(52) U.S. Cl. .............................. 702/57; 702/64; 702/65; 702/74
(58) Field of Classification Search ................. 702/128, 702/150, 151, 179, 182, 183, 57, 64, 65, 702/74; 324/769; 703/14; 706/17; 700/31
See application file for complete search history.

(56) References Cited

U.S. PATENT DOCUMENTS

| | | | | |
|---|---|---|---|---|
| 5,369,603 A | * | 11/1994 | Myers | .......................... 702/86 |
| 5,402,333 A | * | 3/1995 | Cardner | ........................ 700/31 |
| 5,649,064 A | * | 7/1997 | Jorgensen et al. | ............. 706/17 |
| 6,219,630 B1 | | 4/2001 | Yonezawa et al. | |
| 6,735,558 B1 | * | 5/2004 | Yamaguchi | .................. 703/14 |
| 6,795,800 B1 | | 9/2004 | Lee | |
| 6,857,112 B1 | | 2/2005 | Teig et al. | |
| 7,092,845 B2 | * | 8/2006 | Keane et al. | ................. 702/182 |
| 2004/0078175 A1 | | 4/2004 | Shaw et al. | |
| 2005/0015235 A1 | | 1/2005 | Maeda et al. | |

FOREIGN PATENT DOCUMENTS

| | | |
|---|---|---|
| JP | 8-029255 | 2/1996 |
| JP | 2001-035930 | 2/2001 |
| WO | WO-01/20429 | 3/2001 |

OTHER PUBLICATIONS

European Search Report, European Patent Application No. 06026507.1, dated Mar. 7, 2007.

* cited by examiner

*Primary Examiner*—Eliseo Ramos Feliciano
*Assistant Examiner*—Felix E Suarez
(74) *Attorney, Agent, or Firm*—Cook Alex Ltd.

(57) ABSTRACT

A structure includes a step of inputting a numerical value of a parameter, which forms a model formula, by a computer; a step of inputting the numerical value of the parameter to the model formula and calculating a calculation value by the computer; and a step of evaluating degree of a match between an actual measurement value and the calculation value by the computer with an input/output response of an actual device assumed as the actual measurement value, in which the degree of the match is evaluated by a numerical value corresponding to an area of a portion sandwiched between a connecting line of the actual measurement value and a connecting line of the calculation value.

12 Claims, 11 Drawing Sheets

PRIOR ART

PRIOR ART

PRIOR ART

PARAMETER EXTRACTION METHOD, METHOD FOR INSPECTING CIRCUIT OPERATION, AND STORAGE MEDIUM HAVING PROGRAM TO PERFORM THE PARAMETER EXTRACTION METHOD

BACKGROUND OF THE INVENTION

1. Field of the Invention

The present invention relates to a parameter extraction method of an element having a plurality of parameters, a method for inspecting a circuit operation using an element parameter extracted by the parameter extraction method, and a storage medium having a program to perform the parameter extraction method. In particular, the present invention relates to an element parameter extraction method, a method for inspecting a circuit operation, and a storage medium having a program to perform the parameter extraction method, in semiconductor circuit simulation for inspecting an operation of a designed circuit based on a given parameter that expresses an operation of a circuit component element using a model formula of a semiconductor element in designing a semiconductor circuit.

2. Description of the Related Art

In circuit simulation (also referred to as circuit operation inspection), generally, a circuit operation is inspected by inputting several conditions required for circuit simulation, such as circuit connection information, an element parameter, an analysis condition, and an output condition, and by using the inputted information with or without modification.

Among the inputted information, the element parameter is a parameter included in a model formula that mathematically expresses a relation of physical quantities corresponding to an input and an output of an element. For example, BSIM3 MOSFET Model or the like is given as the model.

Instead of using the element parameter, circuit simulation can be conducted by using a method of reproducing an operation of an element in a device simulation apparatus. However, when a device simulation apparatus is used in combination with a circuit simulation apparatus, analysis scale expands despite improvement of analysis accuracy, and moreover, analysis speed gets slower, which is impracticable. Thus, a device simulation apparatus is not often employed.

Therefore, in a case of simulation of a large-scale circuit, generally, an operation of an element that forms a circuit is expressed by a model formula and its element parameter, and the information on the model formula and the element parameter is processed in a circuit simulation apparatus. Thus, circuit simulation is conducted. In this case, if element characteristics reproduced from the model formula and the element parameter do not match well with characteristics of an element that actually forms a circuit, a result of the circuit simulation does not match with an analysis result of the circuit that is actually formed.

Therefore, there are some evaluation formulae for quantitatively evaluating the match between actual element characteristics and characteristics expressed by the model formula. When it is assumed that an input/output response obtained from physical measurement of an actually formed element be an actual measurement value (hereinafter also referred to as meas) and an input/output response calculated from the given model formula and its element parameter be a calculation value (hereinafter also referred to as sim), a difference between each actual measurement value and each calculation value can be evaluated. In other words, the difference between each actual measurement value and each calculation value can be regarded as a difference between output values of the actual measurement value and the calculation value of which input values are equal to each other.

Instead of the difference between each actual measurement value and each calculation value, a difference between the whole actual measurement value and the whole calculation value can be evaluated. In general, the difference between the actual measurement value and the calculation value is evaluated by a mean error or a mean square error of the difference between the actual measurement value and the calculation value (see, for example, Reference 1: Japanese Published Patent Application No. H8-29255 and Reference 2: Japanese Published Patent Application No. 2001-35930). Each actual measurement value is given a number, and the calculation value of which input value is equal to the i-th actual measurement value is similarly numbered as the i-th calculation value. Then, when the difference between their output values is denoted as error (i), the mean error can be evaluated by (Formula 1).

$$\frac{100}{N}\left(\sum_{i=1}^{N} \text{error}(i)\right) \qquad \text{[Formula 1]}$$

Moreover, the mean square error can be evaluated by (Formula 2).

$$\frac{100}{N}\sqrt{\sum_{i=1}^{N}\{\text{error}(i)\}^2} \qquad \text{[Formula 2]}$$

It is to be noted that, in (Formula 1) and (Formula 2), N is the number of actual measurement data, which is also equal to the number of the calculation data.

As thus described, there are formulae that evaluate the match between each actual measurement value and each calculation value of element characteristics and that evaluate the match as a whole between the calculation value and the actual measurement value of element characteristics. However, when using these formulae, in some cases, the degree of the match as a whole between the actual measurement value and the calculation value based on the appearance did not correspond to the degree of the match obtained by quantitatively evaluating with the above (Formula 1) and (Formula 2).

Hereinafter, as a specific example, description is made of the estimate on the difference between the actual measurement value and the calculation value (hereinafter referred to as an error regardless of whether it is the difference of each data or the difference as a whole), by using drawings and flow charts.

FIG. 9 is a flow chart of a conventional method for evaluating errors. First, a formula for evaluating an error, which is a difference between an actual measurement value and a calculation value, is selected (Step S901).

Next, an error at each data point is stored (Step S902). Here, the term "store" means temporal storage for calculating a mean error or a mean square error in the next step.

Subsequently, the mean error and the mean square error are calculated by using the error stored at each data point (Step S903).

The mean error and the mean square error calculated in Step S903 are outputted to complete the evaluation on the error, which is the difference between the actual measurement value and the calculation value (Step S904).

FIG. 10 shows an actual measurement value and a calculation value concerning gate voltage–drain current characteristics of a TFT (Thin Film Transistor, hereinafter also referred to as TFT). In FIG. 10, the actual measurement value is shown by a curved line expressed by circular plots, a calculation value 1 is shown by a curved line expressed by x-marks, and a calculation value 2 is shown by a curved line expressed by triangular marks. As for FIG. 10, assuming that the error between the actual measurement value and the calculation value be obtained by dividing the difference between the actual measurement value and the calculation value by the actual measurement value, Table 1 shows the mean error of (Formula 1) and the mean square error of (Formula 2).

TABLE 1

|  | mean error | mean square error |
|---|---|---|
| error by difference between actual measurement value and calculation value 1 | 425443.1 | 236499.4 |
| error by difference between actual measurement value and calculation value 2 | 38.05939 | 6.779373 |

In FIG. 10, it seems that the calculation values 1 and 2 are both similarly apart from the actual measurement value. However, when the error between the actual measurement value and the calculation value is evaluated by the mean error of (Formula 1) or the mean square error of (Formula 2), the difference between the both reaches several tens of thousands times. It is to be noted that (Formula 1) and (Formula 2) are the comprehensive and quantitative evaluation formulae for the actual measurement value and the calculation value.

The widening of gap in the mean error and the mean square error is caused by dividing the difference between the actual measurement value and the calculation value by the actual measurement value. By dividing the difference between the actual measurement value and the calculation value by the actual measurement value, evaluation can be made by the proportion (%) of the difference between the actual measurement value and the calculation value, which enables the evaluation to be more accurate. However, the smaller the actual measurement value is, the more the difference between the actual measurement value and the calculation value is amplified. Accordingly, if the difference is the same, the smaller the actual measurement value is, the more a result of dividing the difference between the actual measurement value and the calculation value by the actual measurement value is increased. That is to say, among the whole actual measurement values, a relatively smaller value contributes more to the mean error or the mean square error. In particular, when the actual measurement value changes exponentially, the relatively smaller actual measurement value contributes more significantly to the mean error or the mean square error.

For example, in vicinity of threshold voltage of a transistor, as shown in FIG. 11, the calculation value is several tens of thousands times the actual measurement value, so that the difference between the actual measurement value and the calculation value was regarded as a significant difference. FIG. 11 shows gate voltage–drain current characteristics of a TFT, in which the actual measurement value and the calculation values are shown with logarithm on a vertical axis. FIG. 11 is substantially the same as FIG. 10.

However, in order to extract the element parameter, it was necessary that after making the actual measurement value and the calculation value match with each other as well as possible, the element parameter inversely obtained from the calculation value be extracted. If not, even the accuracy of circuit simulation could not be expected. Thus, it was necessary to confirm the match between the actual measurement value and the calculation value on the graph or confirm the match by the aforementioned mean error or mean square error (MSE).

Therefore, it is a problem that, in evaluation on the degree of the match between an actual measurement value and a calculation value based on the appearance and the error between an actual measurement value and a calculation value based on the mean error or the mean square error, there is a gap in the degree of the match between the obtained actual measurement value and calculation value.

SUMMARY OF THE INVENTION

The present invention made in view of the aforementioned problem is a replacement of evaluation on an error between an actual measurement value and a calculation value by a mean error or a mean square error in a parameter extraction method of a parameter element in a model formula having a physical meaning. In other words, the present invention provides a new parameter extraction method of a parameter element, a new method for inspecting a circuit operation using an extracted parameter, and a new storage medium having a program to perform the parameter extraction method.

In view of the aforementioned problem, the present invention provides a parameter extraction method, a method for inspecting a circuit operation using an extracted parameter, and a storage medium having a program to perform the parameter extraction method, that replace the evaluation on an error between an actual measurement value and a calculation value by a mean error or a mean square error.

A parameter extraction method of the present invention includes a step of inputting a numerical value to a parameter of a model formula, by a computer; a step of calculating a calculation value by using the model formula by the computer; and a step of evaluating degree of a match between an actual measurement value and the calculation value by the computer with an input/output response of an actual device assumed as the actual measurement value. In this method, the degree of the match between the actual measurement value and the calculation value is evaluated by a numerical value corresponding to an area of a portion sandwiched between a connecting line of the actual measurement value and a connecting line of the calculation value.

Another parameter extraction method of the present invention includes a step of inputting a numerical value to a parameter of a model formula, by a computer; a step of calculating a calculation value by using the model formula by the computer; and a step of evaluating degree of a match between an actual measurement value and the calculation value by the computer with an input/output response of an actual device assumed as the actual measurement value. In this method, the degree of the match between the actual measurement value and the calculation value is evaluated in such a way that a numerical value corresponding to an area of a portion sandwiched between a connecting line of the actual measurement value and a connecting line of the calculation value is obtained by estimating a numerical value corresponding to an area surrounded by adjacent two points of plural pieces of data in the actual measurement value and two points in the calculation value corresponding to the two points in the actual measurement value.

In the parameter extraction method of the present invention, the actual measurement value may be expressed as a two-dimensional graph showing a response of an output physical quantity with respect to an input physical quantity.

In the parameter extraction method of the present invention, the calculation value may be expressed on the two-dimensional graph that expresses the actual measurement value by inputting the parameter that forms the model formula as a specific numerical value.

In addition, in the data extraction method of the present invention, the model formula may be a model formula having a parameter of a semiconductor element.

Further, in a method for inspecting a circuit operation of the present invention, the parameter is described in a netlist together with the model formula or a combination of letters and numerals that express the model formula, and thus circuit calculation is conducted.

A storage medium of the present invention having a program to perform the parameter extraction method stores a program to have a computer perform: a step of inputting a numerical value to a parameter of a model formula, by the computer; a step of calculating a calculation value by using the model formula by the computer; and a step of evaluating degree of a match between an actual measurement value and the calculation value by the computer with an input/output response of an actual device assumed as the actual measurement value. In this storage medium, the degree of the match between the actual measurement value and the calculation value is evaluated by a numerical value corresponding to an area of a portion sandwiched between a connecting line of the actual measurement value and a connecting line of the calculation value.

A storage medium of the present invention having a program to perform the parameter extraction method stores a program to have a computer perform: a step of inputting a numerical value to a parameter of a model formula, by the computer; a step of calculating a calculation value by using the model formula by the computer; and a step of evaluating degree of a match between an actual measurement value and the calculation value by the computer with an input/output response of an actual device assumed as the actual measurement value. In this storage medium, the degree of the match between the actual measurement value and the calculation value is evaluated in such a way that a numerical value corresponding to an area of a portion sandwiched between a connecting line of the actual measurement value and a connecting line of the calculation value is obtained by estimating a numerical value corresponding to an area surrounded by adjacent two points of plural pieces of data in the actual measurement value and two points in the calculation value corresponding to the two points in the actual measurement value.

In the storage medium of the present invention, the actual measurement value may be expressed as a two-dimensional graph showing a response of an output physical quantity with respect to an input physical quantity.

In the storage medium of the present invention, the calculation value may be expressed on the two-dimensional graph that expresses the actual measurement value by inputting the parameter that forms the model formula as a specific numerical value.

In accordance with the present invention, evaluation similar to the evaluation of the match between the actual measurement value and the calculation value based on the appearance can be conducted in a quantitative manner. Moreover, the indicator of the error between the actual measurement value and the calculation value is not increased wastefully, and moreover, the appearance of the graph can match well with the numerical value of the indicator; thus, parameter extraction with high accuracy can be conducted efficiently. Therefore, when parameter extraction is conducted automatically, the degree of the match between the actual measurement value and the calculation value can be known without referring to the graph.

Furthermore, conventionally, the degree of the match between the actual measurement value and the calculation value was saved in a graph form and confirmed visually. However, in accordance with the present invention, in a case of automatic parameter extraction from a large amount of actual measurement data, the necessity of plotting all results on the graph can be reduced, which can save a storage region of a storage device. Thus, reduction in the amount of data to be managed can save people the troubles.

In addition, since the degree of the match between the actual measurement value and the calculation value can be treated as a quantitative value with favorable consistency to the appearance, a computer can judge the degree of the match between the actual measurement value and the calculation value differently from the judge based on the appearance of the actual measurement value and the calculation value. Thus, the present invention can be effectively used in a case of adding a process by a computer itself.

DETAILED DESCRIPTION OF THE INVENTION

Figure 1:
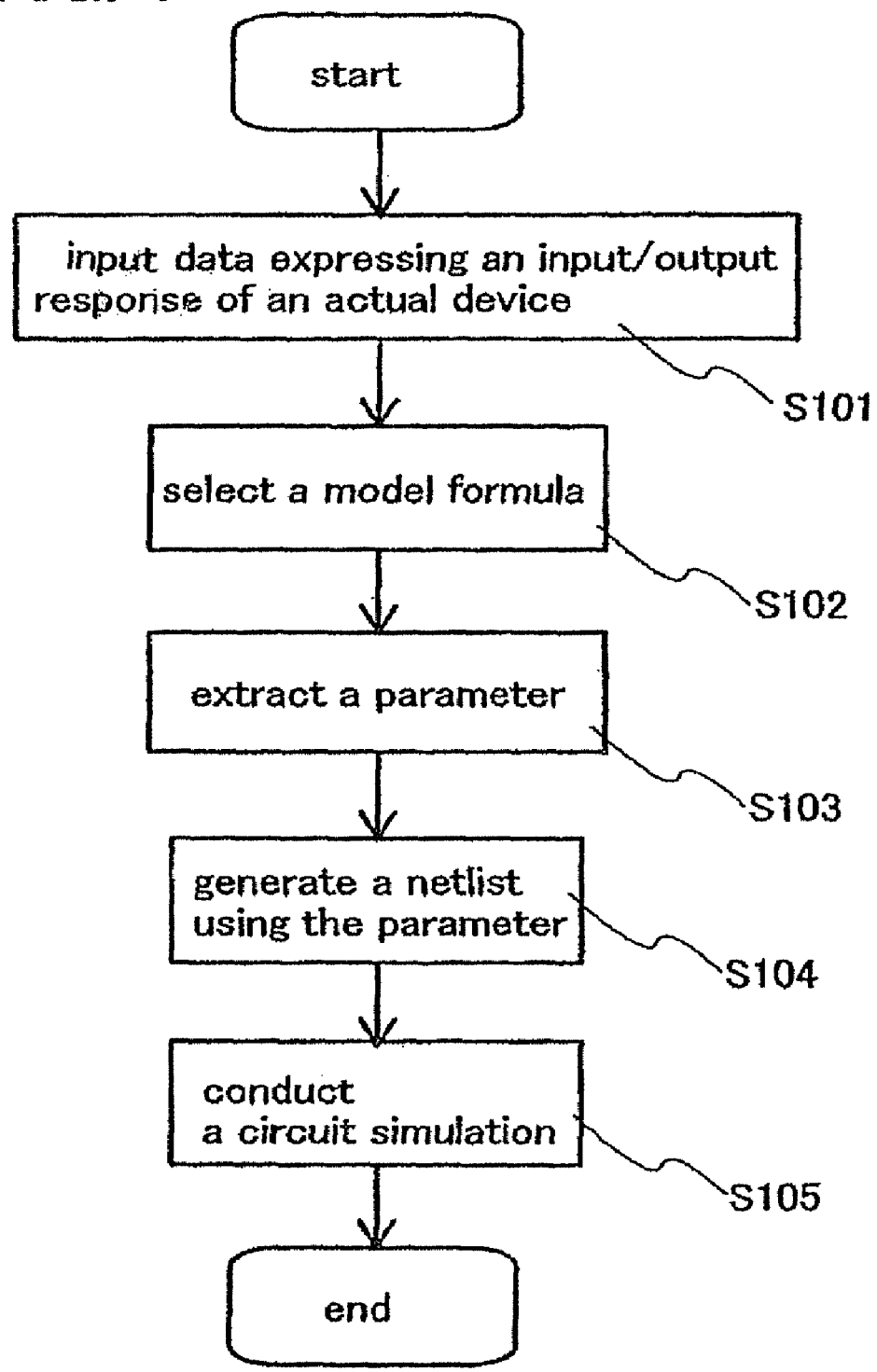
FIG. 1 is a flow chart for explaining a parameter extraction method of the present invention.

Embodiment modes and an embodiment are hereinafter described based on drawings. However, since the present invention can be embodied in many different modes, it is easily understood by those skilled in the art that the mode and detail can be variously changed without departing from the scope and spirit of the present invention. Therefore, the present invention is not construed as being limited to the description of the embodiment modes and embodiment. In all the drawings for explaining the embodiment modes and embodiment, the same portions or portions having a similar function are denoted with the same reference numeral and description of such portions is not repeated.

Embodiment Mode 1

Embodiment Mode 1 will explain a parameter extraction method in the present invention, a flow chart of the parameter extraction method, and a flow chart of circuit simulation using the present invention.

FIG. 1 shows a flow chart of circuit simulation using the present invention.

FIG. 1 is explained. Here, circuit simulation of a MOSFET in a semiconductor integrated circuit is explained. In FIG. 1, first, a user selects an actual device and measures element characteristics of the actual device, and then inputs plural pieces of data expressing an input/output response of the actual device to a storage portion of a computer (Step S101). As the actual device, a transistor, a resistor, or the like is given. Moreover, a physical characteristic value of the measured element is called an actual measurement value.

The actual device herein described only needs to have physical characteristics such as characteristics of a semiconductor element or the like, and show a response of an output physical quantity with respect to an input physical quantity. As the semiconductor element, an active element or a passive element may be given. As the active element, for example, a MOSFET, a TFT, an SOI transistor, a bipolar transistor, or the like is given. As the passive element, for example, a resistor, a capacitor, or the like is given.

The physical characteristics of an element described here mean a relation of an input signal value and an output signal value that are measured with all the conditions except an input signal fixed, in an actual element using various physical phenomena. Then, a measurement value of each output signal that expresses physical characteristics is called an actual measurement value. In other words, the actual measurement value can be expressed as a two-dimensional graph.

Next, in accordance with data of an input/output response of the actual device which is inputted to the storage portion in Step S101, a user selects a model formula that corresponds to the data of the input/output response of the actual device (Step S102). In Step S102, in a case of a MOSFET as a semiconductor element, the model formula may be, for example, BSIM3 model developed by University of California, Berkeley (UCB), or another existing model formula. The model formula of the semiconductor element is expressed by a formula including an element parameter. By obtaining each parameter, simulation can be conducted on a virtual device with its characteristics similar to those of the actual device. In circuit simulation, SPICE (Simulation Program with Integrated Circuit Emphasis) developed by UCB, which is used mainly for a semiconductor field, may be employed.

In this embodiment mode, description is made assuming that an RPI polysilicon model be selected as the model formula. A user may select a model formula depending on a condition such as selection of the actual device. For example, in a case of a model formula for a MOSFET, a user may select from LEVEL1, LEVEL2, LEVEL3, BSIM1, BSIM2, BSIM3, and the like. In a case of a model formula for a TFT, a user may select from an RPI polysilicon TFT Model, an RPI amorphous TFT Model, and the like. In a case of an SOI, a user may select from an UFSOI Model and the like.

After the input of data of an input/output response of the actual device by a user and the selection of the model formula by a computer, parameter extraction is conducted using the present invention by the computer (Step S103). An extraction method of each parameter is later described in detail.

After function designing or specification describing of a semiconductor integrated circuit with hardware description language (HDL), a netlist for specifying a connecting relation of a cell stored in a cell library in order to achieve a function described in the HDL is generated using each parameter extracted in the model formula (Step S104; this step is called logic synthesis).

In logic synthesis, timing information and logic information of each cell stored in a cell library are mainly referred to. Then, cell selection and connection are made so that a desired function is achieved and so that a delay time calculated from the timing information satisfies the predetermined standard. Thus, circuit simulation can be conducted (Step S105).

Figure 2:
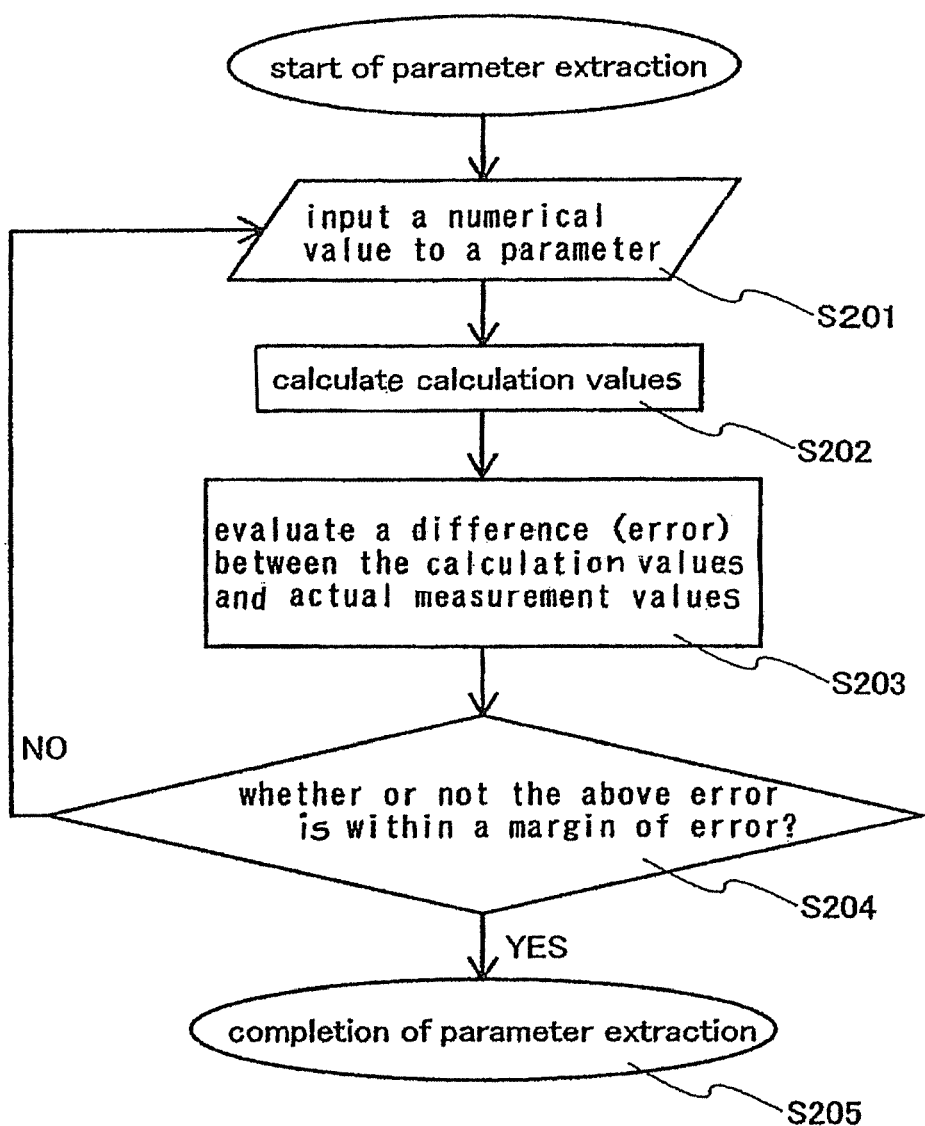
FIG. 2 is a flow chart for explaining a parameter extraction method of the present invention.

Next, FIG. 2 shows a flow chart of a parameter extraction method using the present invention.

FIG. 2 is explained. Here, a parameter extraction method of a transistor in a semiconductor integrated circuit is explained. Before the parameter extraction, in accordance with the input data of the input/output response of the actual device (FIG. 1; Step S101), a model formula that corresponds to the data of the input/output response of the actual device is selected from among the model formulae having physical meanings by a user (FIG. 1; Step S102). Description is made here assuming that the aforementioned model formula, BSIM3 here, is selected as the model formula.

In the flow chart of the parameter extraction method of the present invention shown in FIG. 2, first, a numerical value is inputted to a parameter of the model formula by a computer (Step S201). In a case of a transistor, for example, a numerical value is inputted to a parameter having a physical meaning such as threshold voltage of the transistor. A method of inputting the numerical value to the parameter depends on the model formula and is selected appropriately. Needless to say, a user may restrict a condition of each parameter and input the parameter. In this manner, parameters can be calculated more accurately when a user restricts a condition of each parameter; therefore, higher-speed calculation process becomes possible.

Before and after Step S201, the data of the input/output response of the actual measurement value is read out from the storage portion. The actual measurement value, which shows physical characteristics of a semiconductor element or the like as the actual device and a response of an output physical quantity with respect to an input physical quantity, is quantified and stored in advance in the storage portion of the computer. The data of the input/output response of the actual measurement value from the storage portion may be outputted by a process by a computer or a process by a user.

Before and after Step S201, a user inputs margin of error of the calculation value and the actual measurement value. The margin of error is preferably as small as possible, and it may be set appropriately in accordance with the specification in circuit simulation.

Next, the calculation value is calculated based on the numerical value of the parameter inputted by the computer in Step S201 (Step S202).

The calculation value herein described means a value calculated by inputting, as a specific numerical value, a parameter which forms a model formula that expresses element characteristics in accordance with physical law that an element follows. That is to say, by the input of the parameter, the aforementioned model formula can be expressed as the calculation value in a two-dimensional graph form corresponding to a graph of the actual measurement value.

Subsequently, a computer evaluates a difference (error) between the calculation value and the actual measurement value as the indicator for degree of a match between the actual measurement value and the calculation value calculated in Step S202 (Step S203). The evaluation between the calculation value and the actual measurement value by a computer is later described in detail.

Next, whether the difference between the calculation value and the actual measurement value estimated in Step S203 is within or out of the margin of error inputted by a user is judged (Step S204). If the difference between the calculation value and the actual measurement value is out of the margin of error inputted by a user, a computer returns to Step S201 to input a numeral value of a parameter again.

In Step S204, when the difference between the actual measurement value and the calculation value estimated in Step S203 is within the margin of error inputted by a user, the estimate on the numerical value of the parameter is regarded as being completed. Thus, the parameter extraction is completed (Step S205).

It is to be noted that an operation for changing the parameter so as to bring the calculation value close to the actual measurement value is called fitting. In this case, particularly, an operation for automatically changing the parameter by a computer is also called automatic fitting. When the difference between the calculation value and the actual measurement value is within the margin of error, it is regarded that the fitting is completed, and the output of the value of each parameter is called parameter extraction.

The parameter and the error between the calculation value and the actual measurement value estimated in Step S203 may be outputted together in Step S205.

Figure 3:
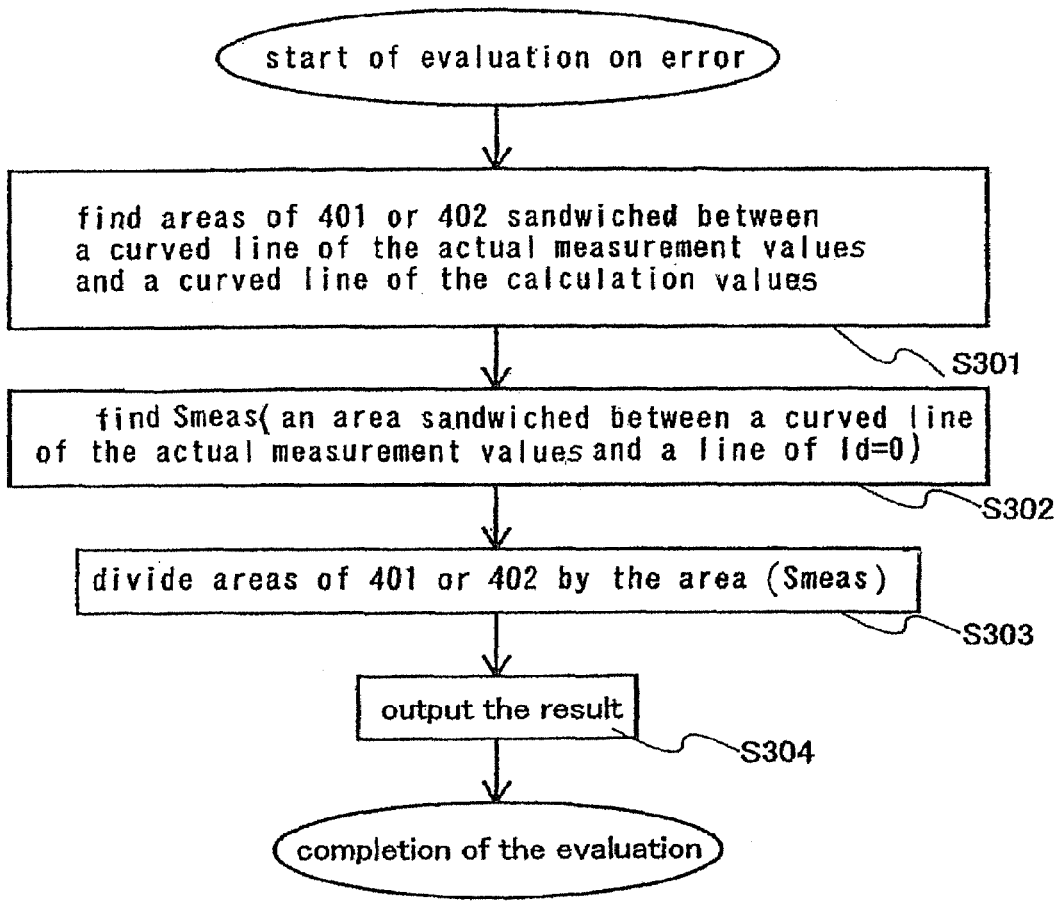
FIG. 3 is a flow chart for explaining a parameter extraction method of the present invention.

Next, with reference to a flow chart in FIG. 3 and numerical formulae, description is made of evaluation on a calculation value and an actual measurement value in a parameter extraction method of the present invention.

Electrical characteristics of a TFT include drain current and gate voltage characteristics (ID-VG characteristics) obtained in such a way that a drain current value is measured by sweeping gate voltage, and drain current and drain voltage characteristics (ID-VD characteristics) obtained in such a way that a drain current value is measured by sweeping drain voltage.

The ID-VG characteristics can be expressed by plotting on a graph a result of measuring a drain current value while changing gate voltage by a constant low level with drain voltage kept constant. The ID-VD characteristics can be expressed by plotting on a graph a result of measuring a drain current value while changing drain voltage by a constant low level with gate voltage kept constant.

The ID-VG characteristics and the ID-VD characteristics are aggregations including finite units of dots of drain current values at each gate voltage and each drain voltage, respectively and it is possible to give a number to each dot.

Here, evaluation on the error between the actual measurement value and the calculation value is started. It is assumed that the i-th actual measurement value and the i-th calculation value be meas (i) and sim (i), respectively, and then evaluation is conducted on a numerical value corresponding to an area (hereinafter this numerical value is simply referred to as an area) sandwiched between a curved line of the actual measurement value (also called a connecting line of the actual measurement value) and a curved line of the calculation value (also called a connecting line of the calculation value). This step corresponds to Step S301 in the flow chart of FIG. 3.

$$\sum_{i=1}^{N-1} \frac{\left\{ \begin{array}{l} |sim(i) - meas(i)| + \\ |sim(i+1) - meas(i+1)| \end{array} \right\}}{2} \times interval \times \delta \quad \text{[Formula 3]}$$

Figure 4:
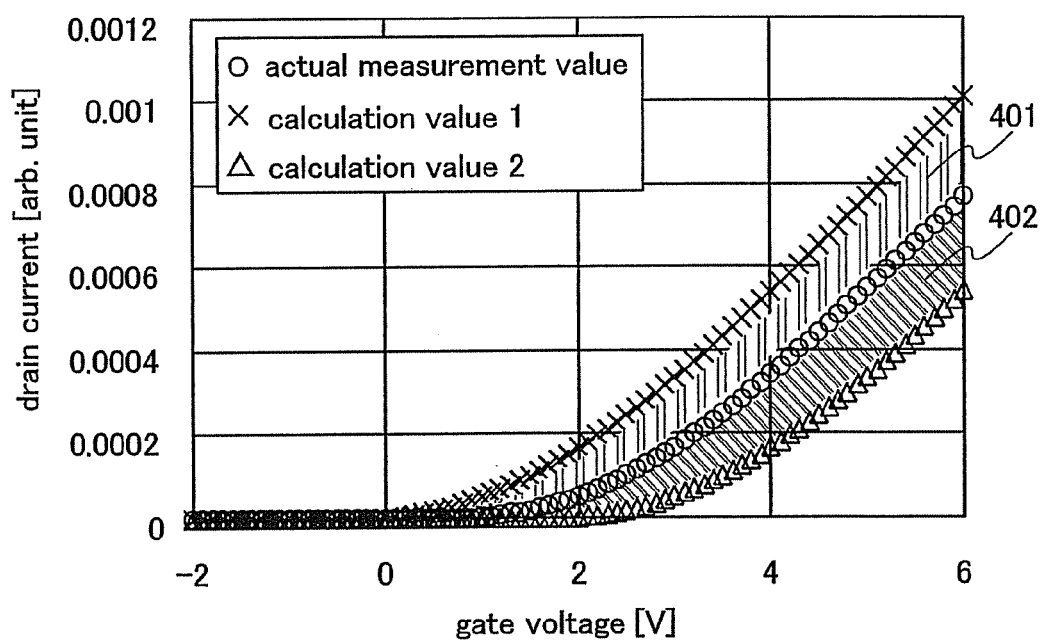
FIG. 4 is an ID-VG characteristic diagram for explaining a parameter extraction method of the present invention.

Step S301 in FIG. 3 that is aforementioned is also equal to evaluation on the calculation value and the actual measurement value by areas of a region 401 and a region 402 in FIG. 4. In other words, an area surrounded by four points including adjacent two points in data of the actual measurement value and two points in data of the calculation value corresponding to the data of the actual measurement value is estimated and summed up to obtain the areas of the regions 401 and 402; thus, evaluation is conducted. That is, evaluation is conducted on a numerical value corresponding to the area sandwiched between the curved line of the actual measurement value and the curved line of the calculation value.

In (Formula 3), N is the number of data and interval is the interval in an x direction between the i-th data and the (i+1)-th data, which corresponds to step width of gate voltage in the example of the ID-VG characteristics shown in FIG. 4. Then, it is assumed that (i−1) be larger than 1 and (i+1) do not exceed the number of data N. Cases against this assumption are not considered because the area cannot be evaluated. Moreover, δ is a parameter for avoiding overestimation on the area sandwiched between the curved line of the actual measurement value and the curved line of the calculation value. To the parameter δ, 0.5 is assigned when the magnitude relation between the actual measurement value and the calculation value is inverted at the i-th and (i+1)-th orders and 1 is assigned in the other cases.

In the example of the ID-VG characteristics shown in FIG. 4, a result of calculation on an area sandwiched between the curved line of the actual measurement value and the curved line of the calculation value with (Formula 3) is as follows.

An area sandwiched between the curved line of the actual measurement value and the curved line of a calculation value 1:

S1=0.00110

An area sandwiched between the curved line of the actual measurement value and the curved line of a calculation value 2:

S2=0.000899

When the areas obtained by S1 and S2 as aforementioned are illustrated, it can be said that the region 401 in FIG. 4 corresponds to S1 and the region 402 in FIG. 4 corresponds to S2.

Figure 5:
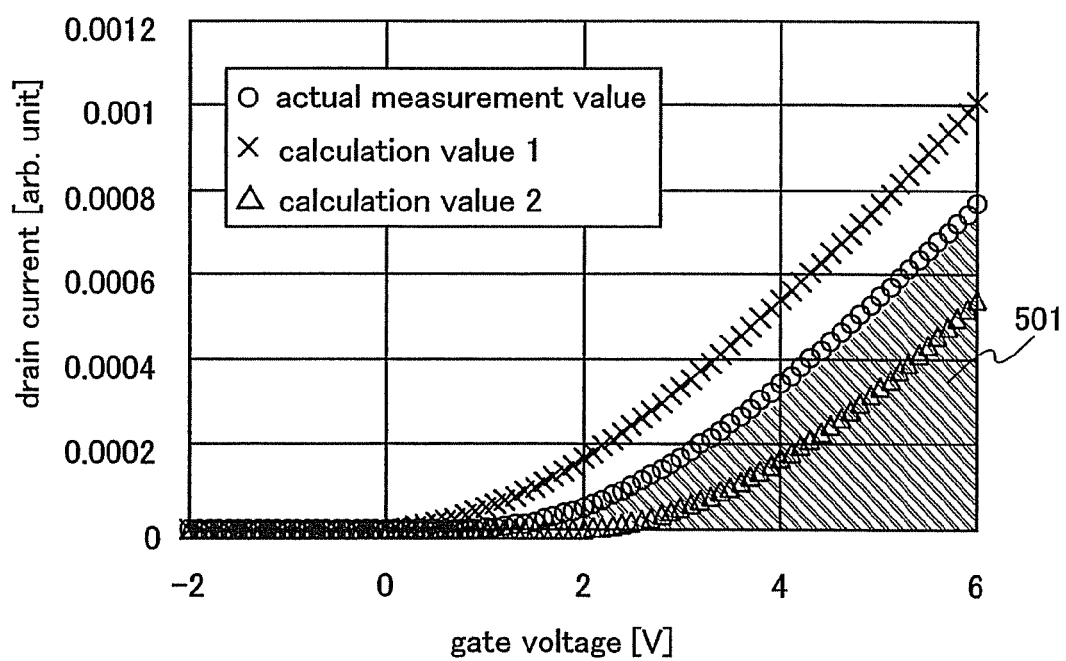
FIG. 5 is an ID-VG characteristic diagram for explaining a parameter extraction method of the present invention.

This suppresses the indicator of the error, which used to be several tens of thousands times, so as to be several times or less. However, if nothing is done, the area becomes either large or small depending on absolute values of the actual measurement value and the calculation value; therefore, the indicator should be corrected to be the one based on the magnitude of the actual measurement value. First, Smeas, which is the numerical value corresponding to an area of a portion sandwiched between the curved line of the actual measurement value and drain current Id=0, is calculated (Step S302). The order of S301 and S302 in FIG. 3 is not particularly limited. Moreover, Smeas is an area corresponding to a region 501 in FIG. 5.

Subsequently, results of dividing S1 and S2 by Smeas are expressed as percentages, which are S1' and S2', respectively.

Then, S1' and S2' are expressed as (Formula 4) and (Formula 5). It is to be noted that this step corresponds to Step S303 in FIG. 3.

$$S1'=100\times S1/Smeas=100\times 0.00110/0.00236=46.8\ (\%) \quad \text{[Formula 4]}$$

$$S2'=100\times S2/Smeas=100\times 0.000899/0.00236=38.1\ (\%) \quad \text{[Formula 5]}$$

As can be seen from (Formula 4) and (Formula 5), the degree of a match between the curved line of the actual measurement value and the curved line of the calculation value can be estimated regardless of the magnitude of the absolute values of the actual measurement value and the calculation value. The smaller these percentages are, the more the curved line of the actual measurement value and the curved line of the calculation value match with each other. Then, the degree of the match is evaluated as the indicator of the error between the calculation value and the actual measurement value and the result is outputted (Step S304 in FIG. 3).

In another structure of this embodiment mode, the difference between the actual measurement value and the calculation value can be made smaller.

An operation region of an element such as a TFT or a MOSFET, which is a semiconductor element, includes an off region in which a transistor as a switch is in an off state. At this time, it is known that very weak current called leak current flows.

A drain current value in the off region is extremely small and often close to limitation of measurement. In this case, a measurement value of drain current may fluctuate. Since such fluctuation cannot be expressed by a model, a portion where the actual measurement value and the calculation value do not match with each other necessarily appears. In that case, it is important in carrying out fitting to evaluate only the error except in the off region and minimize the error. Therefore, in a case of estimating the difference between the actual measurement value and the calculation value in the semiconductor element, the error is evaluated except in the off region.

When gate voltage–drain current characteristics are expressed by the single logarithmic plot, the gradient becomes very close to zero at a boundary between an off region and a sub-threshold region; therefore, the gradient is examined with a log scale in a direction from a high drain current value to a low drain current value. Then, a data number when the gradient is zero or a specified value or less is stored. For example, the number is assumed to be m. When the first data is in the off region, the following (Formula 6) is used.

$$\sum_{i=m}^{N} \text{error} \quad \text{[Formula 6]}$$

When the first data is in an on region, the following (Formula 7) is used.

$$\sum_{i=1}^{m} \text{error} \quad \text{[Formula 7]}$$

Based on which the degree of the match between the actual measurement value and the calculation value is evaluated.

In accordance with the aforementioned procedure, even if the calculation value is either more than or less than the actual measurement value, the degree of the match between the curved line of the actual measurement value and the curved line of the calculation value can be quantified. Conventionally, since there was a large gap between the indicator of the error and the error judged from the appearance of the graph, the indicator of the error was rarely used and the degree of the match between the curved line of the actual measurement value and the curved line of the calculation value was eventually confirmed by the graph. However, when the indicator of the error of the present invention is used, the confirmation by the graph can be omitted and the time of confirming the graph and a memory for storing the graph can be saved.

This embodiment mode can be freely combined with any description of another embodiment mode in this specification.

Embodiment Mode 2

Embodiment Mode 2 will describe a structure for further improving accuracy of a match between a calculation value and an actual measurement value by using the parameter extraction method shown in Embodiment Mode 1.

Next, with reference to a flow chart and numerical formulae, description is hereinafter made of evaluation on a calculation value and an actual measurement value in the parameter extraction method of the present invention.

Electrical characteristics of a TFT include drain current and gate voltage characteristics (ID-VG characteristics) obtained in such a way that a drain current value is measured by sweeping gate voltage, and drain current and drain voltage characteristics (ID-VD characteristics) obtained in such a way that a drain current value is measured by sweeping drain voltage.

The ID-VG characteristics can be expressed by plotting on a graph a result of measuring a drain current value while changing gate voltage by a constant low level with drain voltage kept constant. The ID-VD characteristics can be expressed by plotting on a graph a result of measuring a drain current value while changing drain voltage by a constant low level with gate voltage kept constant. The error, which is the indicator of the degree of the match between an actual measurement value and a calculation value, is estimated by using so-called single logarithmic plot obtained by taking logarithm from plots of drain current in this embodiment mode.

The ID-VG characteristics and the ID-VD characteristics are aggregations including finite units of dots of drain current values at each gate voltage and each drain voltage, respectively and it is possible to give a number to each dot.

Here, evaluation on an error between the actual measurement value and the calculation value is started. It is assumed that the i-th actual measurement value and the i-th calculation value be meas (i) and sim (i), respectively, and then evaluation is conducted on an area sandwiched between a curved line of the actual measurement value and a curved line of the calculation value with (Formula 8). This step corresponds to Step S601 in the flow chart of FIG. 6.

$$\sum_{i=1}^{N-1} \frac{\left\{ \begin{array}{l} |\log(sim(i)) - \log(meas(i))| + \\ \left| \begin{array}{l} \log(sim(i+1)) - \\ \log(meas(i+1)) \end{array} \right| \end{array} \right\}}{2} \times \text{interval} \times \delta \quad \text{[Formula 8]}$$

Figure 6:
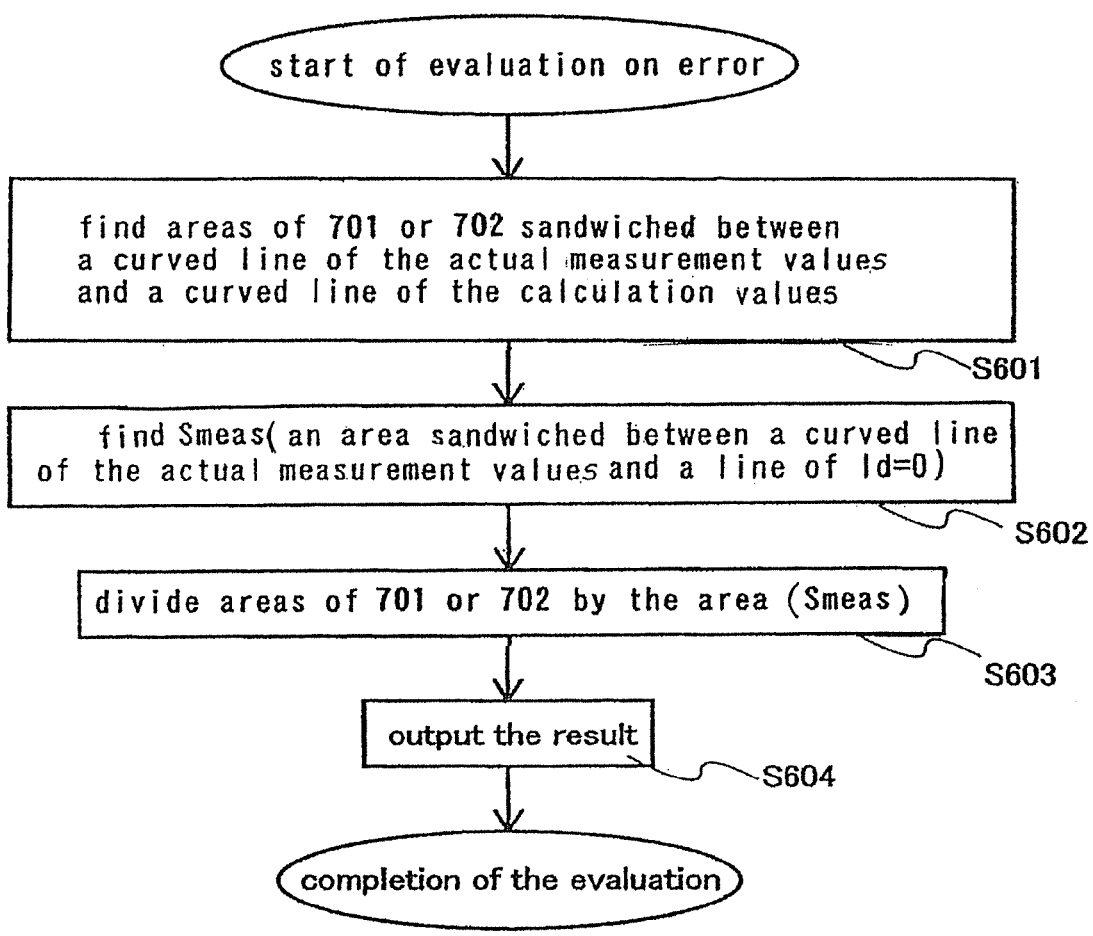
FIG. 6 is a flow chart for explaining a parameter extraction method of the present invention.

Step S601 in FIG. 6 that is aforementioned is also equal to evaluation on the calculation value and the actual measurement value by areas of a region 701 and a region 702 in FIG.

7. In other words, an area surrounded by four points including adjacent two points in data of the actual measurement value and two points in data of the calculation value corresponding to the data of the actual measurement value is estimated and summed up to obtain the areas of the regions 701 and 702; thus, evaluation is conducted. That is, evaluation is conducted on the area sandwiched between the curved line of the actual measurement value and the curved line of the calculation value.

Figure 7:
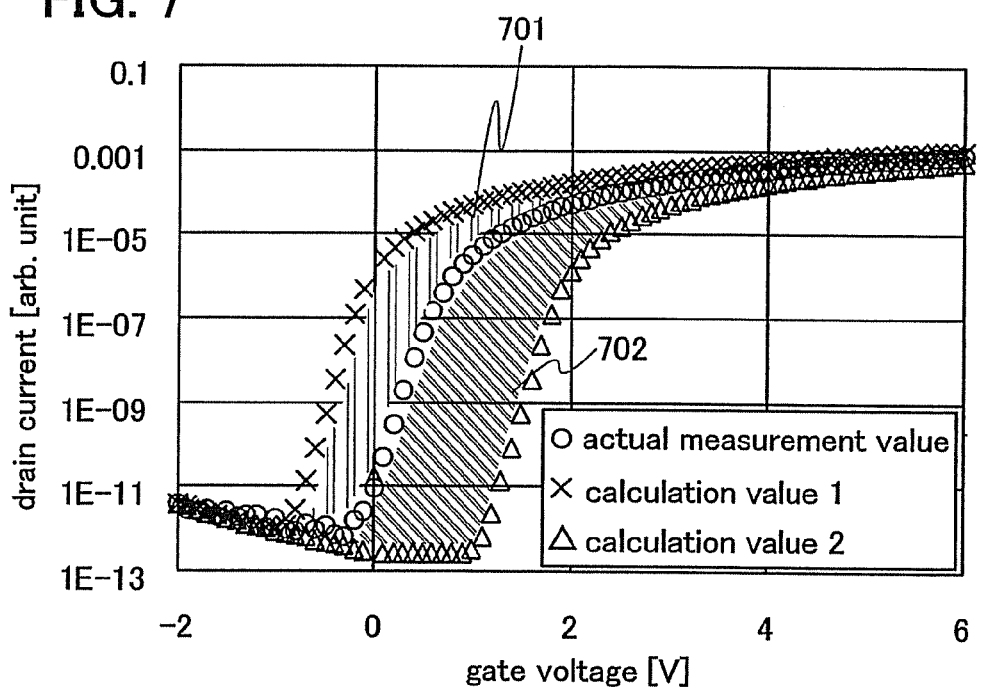
FIG. 7 is an ID-VG characteristic diagram for explaining a parameter extraction method of the present invention.

In (Formula 8), N is the number of data and interval is the interval in an x direction between the i-th data and the (i+1)-th data, which corresponds to step width of gate voltage in the example of the ID-VG characteristics shown in FIG. 7. Then, it is assumed that (i−1) be larger than 1 and (i+1) do not exceed the number of data N. Cases against this assumption are not considered because the area cannot be evaluated. Moreover, $\delta$ is a parameter for avoiding overestimation on the area sandwiched between the curved line of the actual measurement value and the curved line of the calculation value. To the parameter $\delta$, 0.5 is assigned when the magnitude relation between the actual measurement value and the calculation value is inverted at the i-th and (i+1)-th orders and 1 is assigned in the other cases.

In the example of the ID-VG characteristics shown in FIG. 7, results of calculation on areas sandwiched between the curved line of the actual measurement value and the curved lines of the calculation values with (Formula 8) are as follows.

An area sandwiched between the curved line of the actual measurement value and the curved line of the calculation value 1:

$$S1 = 7.45$$

An area sandwiched between the curved line of the actual measurement value and the curved line of the calculation value 2:

$$S2 = 11.6$$

When the areas obtained by S1 and S2 as aforementioned are illustrated, it can be said that the region 701 in FIG. 7 corresponds to S1 and the region 702 in FIG. 7 corresponds to S2.

Figure 8:
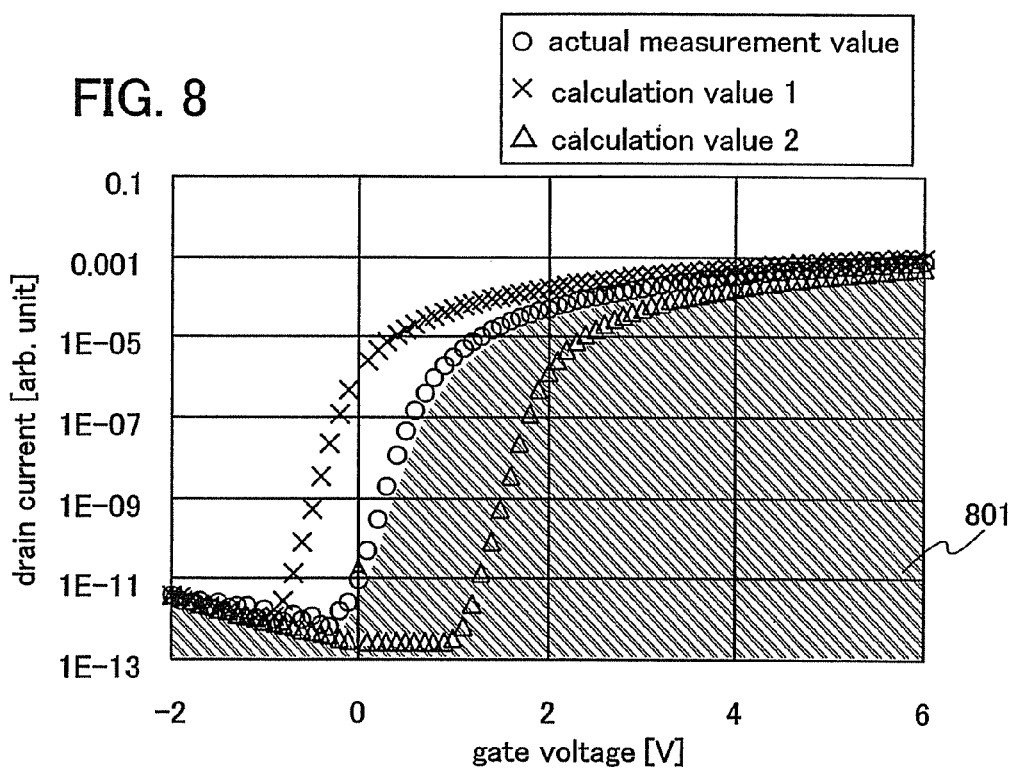
FIG. 8 is an ID-VG characteristic diagram for explaining a parameter extraction method of the present invention.
Figure 9:
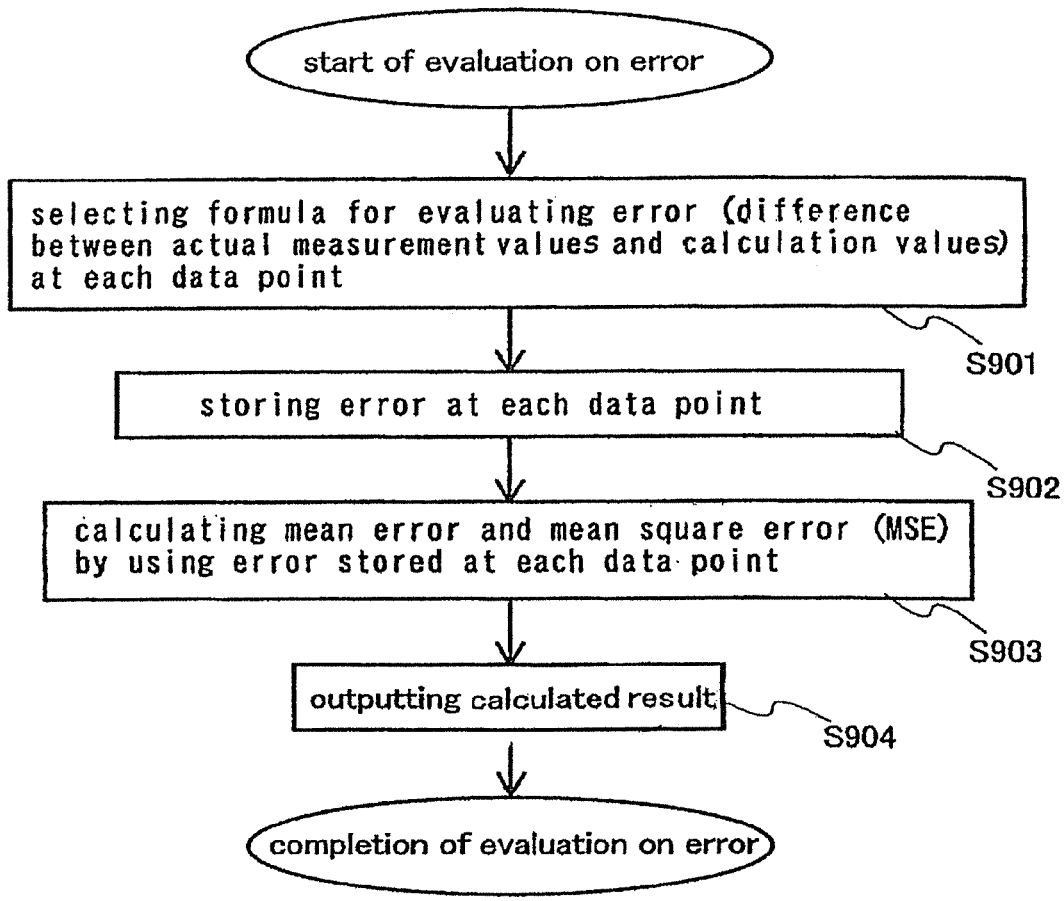
FIG. 9 is a flow chart for explaining a conventional parameter extraction method.
Figure 10:
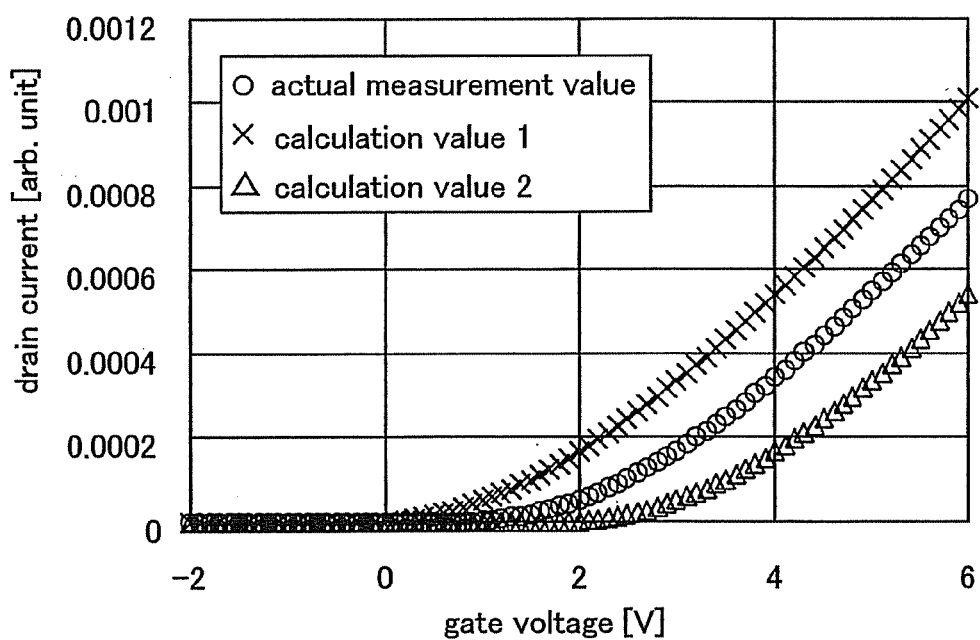
FIG. 10 is an ID-VG characteristic diagram for explaining a conventional parameter extraction method.
Figure 11:
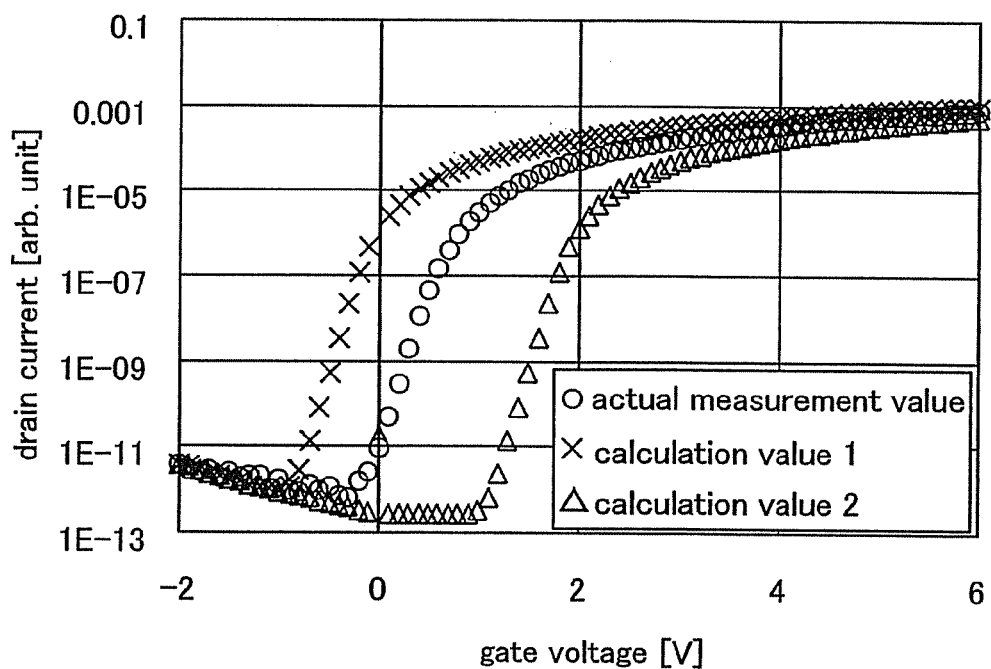
FIG. 11 is an ID-VG characteristic diagram for explaining a conventional parameter extraction method.

This suppresses the indicator of the error, which used to be several tens of thousands times, so as to be several times or less. However, if nothing is done, the area becomes either large or small depending on absolute values of the actual measurement value and the calculation value; therefore, the indicator should be corrected to be the one based on the magnitude of the actual measurement value. First, Smeas, which is the numerical value corresponding to an area of a portion sandwiched between the curved line of the actual measurement value and drain current Id=0, is calculated (Step S602). The order of S601 and S602 in FIG. 6 is not particularly limited. Moreover, Smeas is an area corresponding to a region 801 in FIG. 8.

Subsequently, results of dividing S1 and S2 by Smeas are expressed as percentages, which are S1' and S2', respectively. Then, S1' and S2' are expressed as (Formula 9) and (Formula 10). It is to be noted that this step corresponds to Step S603 in FIG. 6.

$$S1' = 100 \times S1/Smeas = 100 \times 7.45/53.1 = 11.6 \, (\%) \quad \text{[Formula 9]}$$

$$S2' = 100 \times S2/Smeas = 100 \times 11.6/53.1 = 21.9 \, (\%) \quad \text{[Formula 10]}$$

As can be seen from (Formula 9) and (Formula 10), the degree of the match between the curved line of the actual measurement value and the curved line of the calculation value can be estimated regardless of the magnitude of the absolute values of the actual measurement value and the calculation value. However, the smaller these percentages are, the more the curved line of the actual measurement value and the curved line of the calculation value match with each other. Then, the result is outputted as the indicator of the error between the calculation value and the actual measurement value (Step S604 in FIG. 6).

In accordance with the aforementioned procedure, even if the calculation value is either more than or less than the actual measurement value, the degree of the match between the curved line of the actual measurement value and the curved line of the calculation value can be quantified. Conventionally, since there was a large gap between the indicator of the error and the error judged from the appearance of the graph, the indicator of the error was rarely used and the degree of the match between the curved line of the actual measurement value and the curved line of the calculation value was eventually confirmed by the graph. However, when the indicator of the error of the present invention is used, the confirmation by the graph can be omitted and the time of confirming the graph and a memory for storing the graph can be saved.

This embodiment mode can be freely combined with any description of another embodiment mode in this specification.

Embodiment 1

Embodiment 1 will describe a storage medium for storing a parameter extraction method of the present invention as a program, which can be performed by a computer.

A storage medium of the present invention can store the parameter extraction method shown in the above embodiment mode as a computer-readable program to be performed by a computer. For example, the parameter extraction method can be stored in a storage medium such as a magnetic disk, a hard disk, a CD ROM, a memory card, or a magneto-optical disk and read by a computer to be used. A storage medium of the present invention has a program for performing the parameter extraction method. Therefore, the stored program can be read by a computer.

This embodiment can be freely combined with any of the above embodiment modes. Therefore, even if a calculation value is either more than or less than an actual measurement value at parameter extraction in circuit simulation, the degree of a match between the curved line of the actual measurement value and the curved line of the calculation value can be quantified. Conventionally, since there was a large gap between the indicator of the error and the error judged from the appearance of the graph, the indicator of the error was rarely used and the degree of the match between the curved line of the actual measurement value and the curved line of the calculation value was eventually confirmed by the graph. However, when the indicator of the error of the present invention is used, the confirmation by the graph can be omitted and the time of confirming the graph and a memory for storing the graph can be saved.

This application is based on Japanese Patent Application serial no. 2005-376630 filed in Japan Patent Office on Dec. 27, in 2005, the entire contents of which are hereby incorporated by reference.

What is claimed is:

1. A parameter extraction method comprising:
   a step of inputting a first value to one of parameters of a model formula of a transistor, by a computer;
   a step of calculating calculation values by using the model formula by the computer, wherein the calculation values are obtained by changing a variable of the model formula without changing the parameters, the calculation values correspond to drain currents of a transistor, and the variable corresponds to a gate voltage of the transistor; and a step of evaluating the first value by evaluating degree of a match between actual measurement values and the calculation values by the computer, wherein the actual measurement values are obtained by measuring output currents of a transistor with a gate voltage changed, wherein the degree of the match between the actual measurement values and the calculation values is evaluated by a second value corresponding to an area of a portion sandwiched between a connecting line of the actual measurement values shown with logarithm and a connecting line of the calculation values shown with logarithm.

2. The parameter extraction method according to claim 1, wherein the actual measurement values are expressed as a two-dimensional graph showing a response of an output physical quantity with respect to an input physical quantity.

3. The parameter extraction method according to claim 1, wherein the calculation values are expressed on the two-dimensional graph that expresses the actual measurement value by inputting the parameter which forms the model formula as a specific numerical value.

4. A parameter extraction method comprising:

a step of inputting a first value to one of parameters of a model formula of a transistor, by a computer;

a step of calculating calculation values by using the model formula by the computer, wherein the calculation values are obtained by changing a variable of the model formula without changing the parameters, the calculation values correspond to drain currents of a transistor, and the variable corresponds to a gate voltage of the transistor; and a step of evaluating the first value by evaluating degree of a match between actual measurement values and the calculation values by the computer, wherein the actual measurement values are obtained by measuring drain currents of a transistor with a gate voltage changed, wherein the degree of the match between the actual measurement values and the calculation values is evaluated in such a way that a second value corresponding to an area of a portion sandwiched between a connecting line of the actual measurement values shown with logarithm and a connecting line of the calculation values shown with logarithm is obtained by estimating a numerical value corresponding to an area surrounded by adjacent two points of plural pieces of data in the actual measurement values shown with logarithm and two points in the calculation values shown with logarithm corresponding to the two points in the actual measurement value.

5. The parameter extraction method according to claim 4, wherein the actual measurement values are expressed as a two-dimensional graph showing a response of an output physical quantity with respect to an input physical quantity.

6. The parameter extraction method according to claim 4, wherein the calculation values are expressed on the two-dimensional graph that expresses the actual measurement value by inputting the parameter which forms the model formula as a specific numerical value.

7. A computer-readable storage medium comprising a program stored to have a computer perform:

a step of inputting a first value to one of parameters of a model formula of a transistor, by the computer;

a step of calculating calculation values by using the model formula by the computer, wherein the calculation values are obtained by changing a variable of the model formula without changing the parameters, the calculation values correspond to drain currents of a transistor, and the variable corresponds to a gate voltage of the transistor; and a step of evaluating the first value by evaluating degree of a match between actual measurement values and the calculation values by the computer, wherein the actual measurement values are obtained by measuring output currents of a transistor with a gate voltage changed, wherein the degree of the match between the actual measurement values and the calculation values is evaluated by a second value corresponding to an area of a portion sandwiched between a connecting line of the actual measurement values shown with logarithm and a connecting line of the calculation values shown with logarithm.

8. The storage medium according to claim 7, wherein the actual measurement values are expressed as a two-dimensional graph showing a response of an output physical quantity with respect to an input physical quantity.

9. The storage medium according to claim 7, wherein the calculation values are expressed on a two-dimensional graph that expresses the actual measurement values by inputting the parameter, which forms the model formula, as a specific numerical value.

10. A computer-readable storage medium comprising a program stored to have a computer perform:

a step of inputting a first value to one of parameters of a model formula of a transistor, by the computer;

a step of calculating calculation values by using the model formula by the computer, wherein the calculation values are obtained by changing a variable of the model formula without changing the parameters, the calculation values correspond to drain currents of a transistor, and the variable corresponds to a gate voltage of the transistor; and a step of evaluating the first value by evaluating degree of a match between actual measurement values and the calculation values by the computer, wherein the actual measurement values are obtained by measuring drain currents of a transistor with a gate voltage changed, wherein the degree of the match between the actual measurement values and the calculation values is evaluated in such a way that a second value corresponding to an area of a portion sandwiched between a connecting line of the actual measurement values shown with logarithm and a connecting line of the calculation values shown with logarithm is obtained by estimating a numerical value corresponding to an area surrounded by adjacent two points of plural pieces of data in the actual measurement values shown with logarithm and two points in the calculation values shown with logarithm corresponding to the two points in the actual measurement value.

11. The storage medium according to claim 10, wherein the actual measurement values are expressed as a two-dimensional graph showing a response of an output physical quantity with respect to an input physical quantity.

12. The storage medium according to claim 10, wherein the calculation values are expressed on a two-dimensional graph that expresses the actual measurement values by inputting the parameter, which forms the model formula, as a specific numerical value.

\* \* \* \* \*